United States Patent
Dinesh et al.

(10) Patent No.: US 8,295,444 B2
(45) Date of Patent: Oct. 23, 2012

(54) SYSTEMS AND METHODS FOR PERFORMING LOOP ANALYSIS BASED ON UN-CALIBRATED SINGLE-ENDED LINE TESTING

(75) Inventors: Vaibhav Dinesh, Dehli (IN); Kunal Raheja, Noida (IN); Patrick Duvaut, Tinton Falls, NJ (US)

(73) Assignee: Ikanos Communications, Inc., Fremont, CA (US)

( * ) Notice: Subject to any disclaimer, the term of this patent is extended or adjusted under 35 U.S.C. 154(b) by 1167 days.

(21) Appl. No.: 12/138,692

(22) Filed: Jun. 13, 2008

(65) Prior Publication Data

US 2009/0310755 A1 Dec. 17, 2009

(51) Int. Cl.
*H04M 1/24* (2006.01)
*H04M 3/08* (2006.01)
*H04M 3/22* (2006.01)

(52) U.S. Cl. .............. 379/27.01; 379/1.04; 379/27.03
(58) Field of Classification Search .............. 379/1.01, 379/1.03, 1.04, 3, 14.01, 22.01, 22.04, 23, 379/24, 27.01, 27.03, 29.01, 29.05, 29.1, 379/12, 22.08
See application file for complete search history.

(56) References Cited

U.S. PATENT DOCUMENTS

| | | | |
|---|---|---|---|
| 7,460,649 B2 * | 12/2008 | Ouyang et al. ............... | 379/1.04 |
| 2004/0080323 A1 * | 4/2004 | Bostoen et al. ............... | 324/624 |
| 2004/0230390 A1 * | 11/2004 | Galli et al. ............... | 702/66 |
| 2005/0163287 A1 * | 7/2005 | Ouyang et al. ............... | 379/3 |
| 2006/0120442 A1 | 6/2006 | Melsa et al. | |
| 2006/0182169 A1 * | 8/2006 | Belge et al. ............... | 375/222 |
| 2006/0251160 A1 * | 11/2006 | Fazlollahi et al. ............... | 375/222 |

OTHER PUBLICATIONS

Ouyang, Feng, "From ABCD to S Matrix", Conexant Systems Inc. Technical Document, Jun. 12, 2006.
Bell, Alcatel, "SELT: Derivation of Formula for Computation of Calibrated S11", ITU Telecommunications Standardization Sector, COM 15-D 921-E (Study Group 15—Delayed Contribution 921),Oct. 21-31, 2003.
Bostoen, T., Boets, P., Zekri, M., Biesen, L. V., Pollet, T. and Rabijns, D., "Estimation of the Transfer Function of a Subscriber Loop by Means of a One-Port Scattering Parameter Measurement at the Central Office," IEEE Journal on Selected Areas in Communications, vol. 20, No. 5, pp. 936-948, Jun. 2002.

* cited by examiner

*Primary Examiner* — Binh Tieu
(74) *Attorney, Agent, or Firm* — Mark J. Danielson; Pillsbury Winthrop Shaw Pittman LLP

(57) ABSTRACT

Systems and methods for performing loop analysis are described. Some embodiments are directed to determining loop characteristics such as loop gauge, loop termination, and straight-loop departure. One embodiment includes a method for performing loop length estimation which comprises receiving an un-calibrated echo signal for a loop under test using frequency domain reflectometry single-ended line testing (FDR-SELT), a region associated with the loop under test, and a platform type. The method comprises classifying the loop under test and outputting a loop length estimate based on the classification of the loop under test and based on one of a ripple-period approach and a template-matching approach.

24 Claims, 13 Drawing Sheets

SYSTEMS AND METHODS FOR PERFORMING LOOP ANALYSIS BASED ON UN-CALIBRATED SINGLE-ENDED LINE TESTING

TECHNICAL FIELD

The present disclosure generally relates to point-to-point wire line communications and more particularly to single-ended loop testing of digital subscriber line (DSL) communication systems.

BACKGROUND

Prior to deploying xDSL transmissions, a subscriber loop is generally qualified or characterized by estimating the channel capacity, which depends on the transfer function of the network. The subscriber loop (or line) connects the customer premises (CP) to the central office (CO) and can be affected by a wide range of impairments, including but not limited to, load coils, bridge taps, mixed wire gauges, and bad splices. While the loop length and the wire gauge of the loop are generally not considered actual impairments, they can also have a large impact on xDSL transmissions. Other impairments include split pairs, untwisted drop cables, radio-frequency interference (RFI), and cross-talk. Moreover, several of the impairments mentioned above for xDSL transmissions are not present for POTS (plain old telephony service) because xDSL exploits a much wider frequency band as compared to POTS. Consequently, the existing POTS testing equipment is not capable of qualifying a subscriber loop for xDSL transmission.

Due to these impairments, the xDSL network termination (NT) installed at the CP may in some cases not even link up with the xDSL line termination (LT) in the DSL access multiplexer (DSLAM) at the CO. If the xDSL modems do link up with one another, there is no guarantee with respect to the quality-of-service (QoS) in terms of bit rate. Qualifying a subscriber loop for xDSL requires estimating its channel capacity, which depends on the attenuation of the line and also on the noise power spectral density (PSD) at the CO for upstream reception and at the CP for downstream reception, respectively. The estimate of the channel capacity of a particular loop/line will be most accurate if the transfer function of the line and the noise PSD at the CO and CP are known.

Conventional methods for qualifying a subscriber loop include use of xDSL test units available on the market that are capable of performing such measurements. In addition, these test units are often combined with a "golden" modem plug-in module that emulates a real xDSL modem of a certain type, such as ADSL, in order to estimate the actual bit rate instead of only the theoretical channel capacity. However, this approach requires sending a technician to the CP, which is very expensive.

Single-ended loop testing (SELT) can be used to extract information about the transmission environment (e.g., the loop) in a DSL system by performing reflective measurements remotely at the CO/CPE terminal, without the need to dispatch a technician. As an example, SELT may comprise injecting signals into a loop under test at the central office (CO) in order to determine the loop capability for supporting different kinds of DSL services. As such, SELT often plays an important role in DSL provisioning and maintenance.

SUMMARY

Briefly described, one embodiment, among others, includes a method which comprises receiving an un-calibrated echo signal for a loop under test using frequency domain reflectometry single-ended line testing (FDR-SELT), a region associated with the loop under test, and a platform type. The method further comprises classifying the loop under test and outputting a loop length estimate based on the classification of the loop under test and based on one of a ripple-period approach and a template-matching approach.

Another embodiment is a method which comprises receiving a region, a platform type, and an un-calibrated echo signal of a loop under test. The method further comprises estimating loop length based on one of a ripple-period approach and a template-matching approach and determining whether the loop length estimate is greater than or equal to a first threshold. In accordance with some embodiments, the method further comprises performing straight-loop departure detection on the loop under test and indicating the presence of a straight-loop departure in response to determining that the loop length estimate is less than the first threshold. In response to determining that the loop under test is not a straight-loop departure, the method also comprises performing loop gauge detection and performing loop termination detection. In response to determining that the loop length estimate is greater than or equal to the first threshold, the method comprises determining whether the loop length estimate is less than a second threshold. In response to determining that the loop length estimate is less than the second threshold, the method comprises performing loop gauge detection and performing loop termination detection.

Another embodiment is a system that comprises a first module coupled to a loop, wherein the first module is configured to generate a test signal and receive an un-calibrated echo response of the loop. The system further comprises a second module configured to receive the un-calibrated echo response measurement from the first module, the second module configured to determine length estimate of the loop based on the un-calibrated echo response. In accordance with such embodiments, the second module is configured to output a loop length estimate.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

Figure 1:
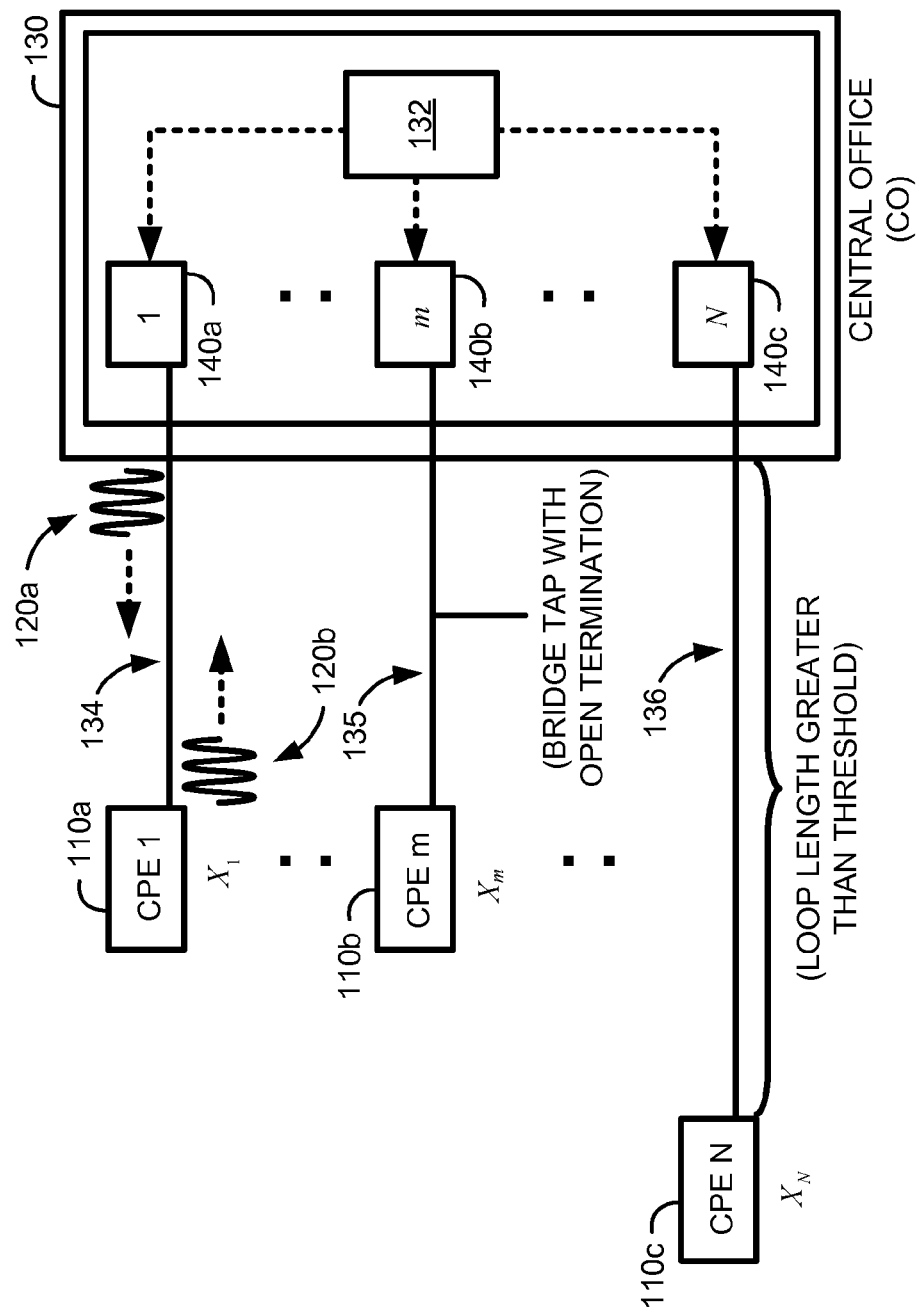
FIG. 1 illustrates an xDSL system in which embodiments of FDR-SELT are applied.

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

In a wire-line broadband system, one of the primary objectives is to qualify a subscriber-loop for xDSL transmission by estimating its channel capacity. This can be achieved if the loop characteristics such as the topology, loop-length and gauge are known. These loop characteristics also serve as useful tools for trouble-shooting and diagnostic purposes in the event that a provisioned service experiences problems or fails.

As discussed earlier, SELT, or single-ended loop testing, can be used to extract valuable information about the transmission environment (e.g., the loop) in a DSL system by performing reflective measurements remotely at the CO/CP (or Modem) terminal, without the need to dispatch a technician. One approach to using SELT involves "per-port calibration," which relates to removing near-end echo, stemming from the measurement equipment, on a per-port basis at the factory. The data derived at the factory for each port is shipped to end users for them to calibrate their equipment. Equipment vendors, however, incur increased equipment cost and operation costs for incorporating calibration data. Furthermore, end users incur the cost of associating the calibration data with the physical units.

Systems and methods are thus described herein for analyzing the un-calibrated echo ($S_{11}(f)$) in the frequency domain to estimate the loop characteristics discussed above. More specifically, the loop length of the subscriber loop is estimated. It should be appreciated that with exemplary embodiments described herein, the use of un-calibrated FDR-SELT techniques avoids the need for conducting a set of reference measurements for each port at the manufacturing plant and storing these measurements for future access. The systems and methods described herein function independently of the port employed in conducting FDR-SELT measurements. It should also be emphasized that the systems and methods for using un-calibrated FDR-SELT measurements may be applied across different central office (CO) platforms and any field deployment scenarios.

It should be noted that in describing representative embodiments herein, various embodiments may be presented as a particular sequence of steps. The methods or processes should not, however, be limited to the particular sequence of steps described. As one of ordinary skill in the art will appreciate, other sequences of steps may be possible, and the particular order of steps set forth herein should not be construed as limitations on the claims. In addition, the claims directed to the method and/or process of various embodiments should not be limited to the performance of their steps in the order written, and one skilled in the art can readily appreciate that the sequences may be varied and still remain within the spirit and scope of the present invention.

Un-Calibrated SELT-FDR Analysis Framework

One technique used for gathering SELT measurements is frequency-domain reflectometry (FDR) where a frequency sweep is performed on the loop under test in order to derive frequency-selective characteristics. For example, peaks in the measured receive signal correspond to frequencies that create standing waves. Measurement of the one-port scattering parameter involves determining the echo response of the loop. For purposes of nomenclature used herein, the echo response may also be referred to as S11, $S_{11}(f)$, or echo signal, and the loop under test may also be referred to as Device Under Test (DUT). Furthermore, the term "raw" echo signal is used to refer to the un-calibrated nature of the measured echo signals. Based on the echo response, the input impedance of the loop as a function of frequency can be determined from which loop characteristics can be estimated. Such characteristics may include, for example, loop length and loop termination type.

When performing single-ended loop testing (SELT), various factors can affect the accuracy of the measurements and ultimately affect any estimations derived from the measurements. One factor is the presence of a long loop where the measuring capability of the system is exceeded. Another factor relates to the topology of the loop itself (such as those due to bridge taps, for example). Accordingly, embodiments described herein for performing SELT indicate when such factors exist, as they can result in erroneous estimations. Systems and methods are described for capturing and analyzing frequency domain reflectometry single-ended loop test (FDR-SELT) measurements to determine whether the response corresponds to a loop that has bridge taps. Exemplary embodiments described herein are based on the un-calibrated FDR-SELT ($S_{11}(f)$) echo in the frequency domain and in particular, on the actual analysis of the un-calibrated echo signal. Based on this analysis, valuable loop information can be derived from different characteristics of the S11 signal.

It should be noted that exemplary embodiments described herein may also include the ability to flag S11 responses that are associated with very long loops in addition to the ability to detect inconsistent loop estimates. For purposes of nomenclature used herein, the term "Layer 0" generally refers to the phase of FDR-SELT whereby a signal is transmitted into the loop under test and the scattering parameters are captured. The term "Layer 1" generally refers to the post-processing phase whereby the data captured in Layer 0 is used to derive meaningful information relating to the DUT.

Reference is now made to FIG. 1, which illustrates an xDSL system in which embodiments of SELT are applied. In the non-limiting example shown in FIG. 1, N end users (or N sets of CPE 110*a*, 110*b*, 110*c*) are depicted where each user 110*a*, 110*b*, 110*c* is referenced using an index m. The end users 110*a*, 110*b*, 110*c* are connected via a loop to a central office (CO) 130, where a SELT module 132 for deriving loop characteristics based on un-calibrated FDR-SELT measurements may be implemented. The CO 130 may include an xDSL access multiplexer (DSLAM), xDSL line cards 140a, 140b, 140c, and other equipment for interfacing with end users 110a, 110b, 110c. In some embodiments, the SELT module may be incorporated into xDSL line cards 140a, 140b, 140c. In other embodiments, the xDSL line cards 140a, 140b, 140c may interface with the SELT module 132. It should be noted that while embodiments for SELT are described here in the context of central offices, the principles of SELT contained in this disclosure may also be incorporated into customer premises equipment as well.

The SELT module 132 first performs Layer 0 functions and injects a test signal 120a onto the loop under test. The reflected signal 120b is then measured to determine the echo response of the loop. The nature of the reflected signal 120b will vary depending on the characteristics of the loop. FIG. 1 shows three non-limiting examples of various loop configurations. Loop 134 is a straight loop configuration, whereas loop 135 and loop 136 depict a bridge tap loop and a long loop, respectively. Generally, the definition of a "long" loop may vary and is based on a predetermined threshold. As a non-limiting example, any loop that exceeds 4 km may be categorized as a long loop.

Figure 2A:
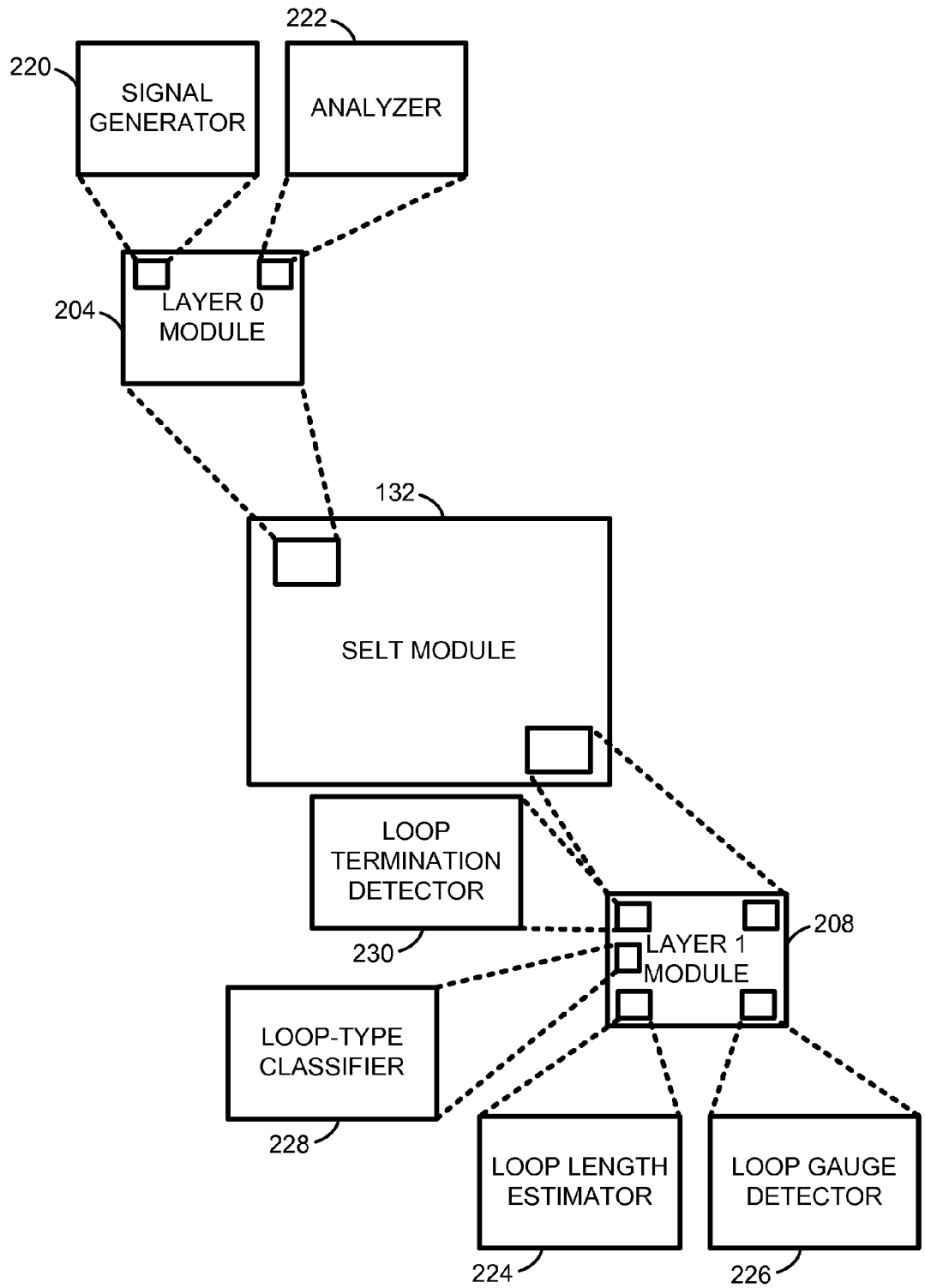
FIG. 2A depicts various components of the FDR-SELT module depicted in FIG. 1.

FIG. 2A depicts various components for the SELT module depicted in FIG. 1. In accordance with exemplary embodiments, the SELT module 132 may comprise a Layer 0 module 204 and a Layer 1 module 208. The Layer 0 module 204 may further comprise a signal generator 220 and an analyzer 222. The signal generator 220 transmits test signals on the loop under test. The analyzer 222 monitors the reflected signal to derive s-parameters associated with the network. The Layer 1 module 208 receives information from the Layer 0 module 204, including an un-calibrated S11 parameter. The Layer 1 module 208 may comprise a loop length estimator 224, a loop-type classifier 228, and a loop termination detector 230. For other embodiments, the Layer 1 module 208 may also include a loop gauge detector 226 if a priori knowledge of the loop gauge is not available.

Figure 2B:
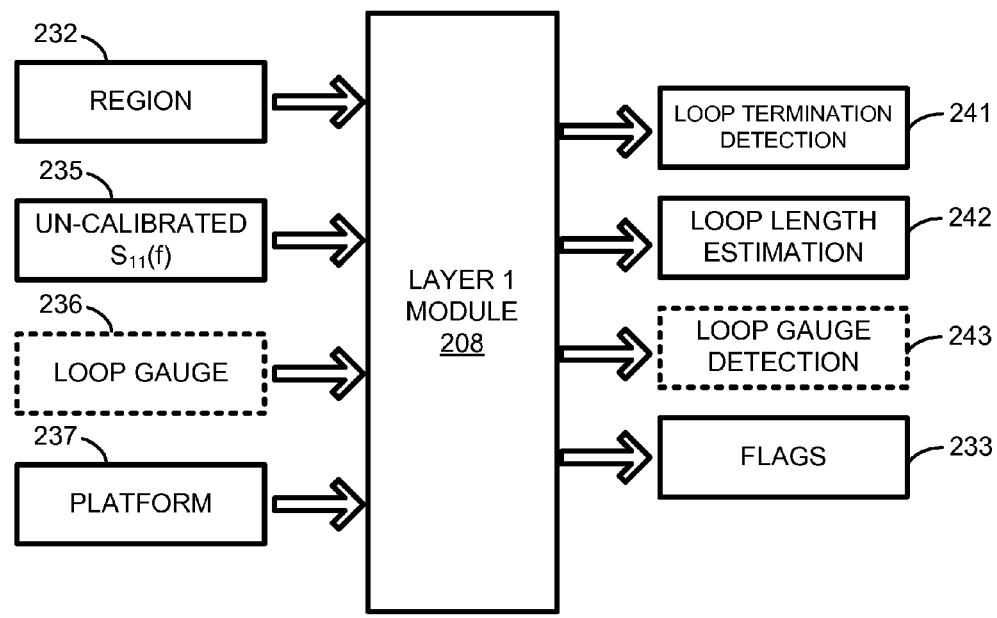
FIG. 2B depicts the signal flow for the Layer 1 module shown in FIG. 2A.

FIG. 2B depicts the signal flow for the Layer 1 module shown in FIG. 2A. Prior to deriving characteristics associated with the loop, the Layer 1 module 208 may receive such inputs as the region 232 associated with the loop. As non-limiting examples, the region may be designated as North America or Japan. The CO (or CPE) platform (i.e., board design information) 237 forms the second input. The un-calibrated S11 parameter 235 is also forwarded to the Layer 1 module 208. Finally, if a priori knowledge regarding the loop gauge is available, this information may also be forwarded to the Layer 1 module 208. It should be noted that for embodiments described herein, loop length estimates can be derived for straight loops up to a predetermined threshold without prior knowledge of the loop gauge. For some embodiments, this predetermined threshold is 4 km (or approximately 13 kft). Based on the inputs, the Layer 1 module 208 derives information relating to the loop, including an estimation of the loop length 242 and the termination type on the loop 241.

It should be emphasized that depending on whether the Layer 1 module 208 determines that the loop under test is not a straight loop, the Layer 1 module 208 may raise various flags 233 to denote that any further analyses may be inaccurate. For example, in the event that the loop is determined to be a long loop, the Layer 1 module 208 will flag that the measuring capabilities of the overall system has been exceeded. As a result, an indicator or flag of some type may be raised. As another example, the Layer 1 module might raise a flag if the presence of a bridge tap is detected or based on some anomaly observed in the S11 signal, an inconsistency is detected in the loop under test. The purpose of these indicators or flags is to convey that the derived loop characteristics (e.g., loop length, termination type, loop gauge) might not be accurate.

Figure 3:
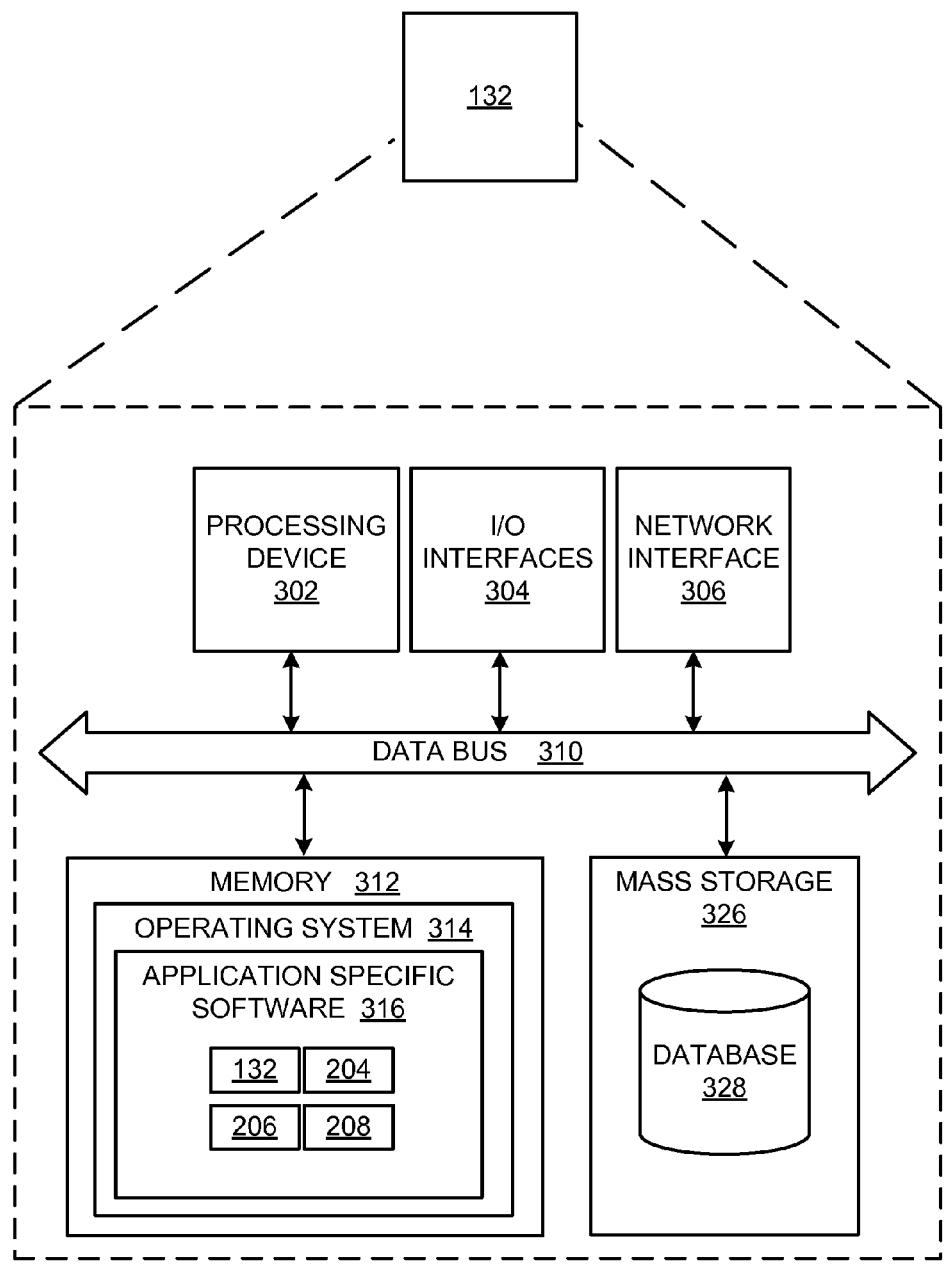
FIG. 3 illustrates an embodiment of the SELT module shown in FIGS. 1 and 2.

Reference is now made to FIG. 3, which illustrates an embodiment of the SELT module shown in FIGS. 1 and 2. Generally speaking, the SELT module 132 may be incorporated into the central office and can comprise any one of a wide variety of computing devices. Irrespective of its specific arrangement, SELT module 132 can, for instance, comprise memory 312, a processing device 302, a number of input/output interfaces 304, a network interface 306, and mass storage 326, wherein each of these devices are connected across a data bus 310.

Processing device 302 can include any custom made or commercially available processor, a central processing unit (CPU) or an auxiliary processor among several processors associated with the SELT module 132, a semiconductor based microprocessor (in the form of a microchip), a macroprocessor, one or more application specific integrated circuits (ASICs), a plurality of suitably configured digital logic gates, and other well known electrical configurations comprising discrete elements both individually and in various combinations to coordinate the overall operation of the computing system.

The memory 312 can include any one of a combination of volatile memory elements (e.g., random-access memory (RAM, such as DRAM, and SRAM, etc.)) and nonvolatile memory elements (e.g., ROM, hard drive, tape, CDROM, etc.). The memory 312 typically comprises a native operating system 314, one or more native applications, emulation systems, or emulated applications for any of a variety of operating systems and/or emulated hardware platforms, emulated operating systems, etc. For example, the applications may include application specific software 316 such as the Layer 0 module 204 and Layer 1 module 208 depicted in FIG. 2A. One of ordinary skill in the art will appreciate that the memory 312 can, and typically will, comprise other components which have been omitted for purposes of brevity.

Input/output interfaces 304 provide any number of interfaces for the input and output of data. With further reference to FIG. 3, network interface device 306 comprises various components used to transmit and/or receive data over a network environment. The SELT module 132 may further comprise mass storage 326. For some embodiments, the mass storage 326 may include a database 328 to store and manage such data as metadata.

Figure 4:
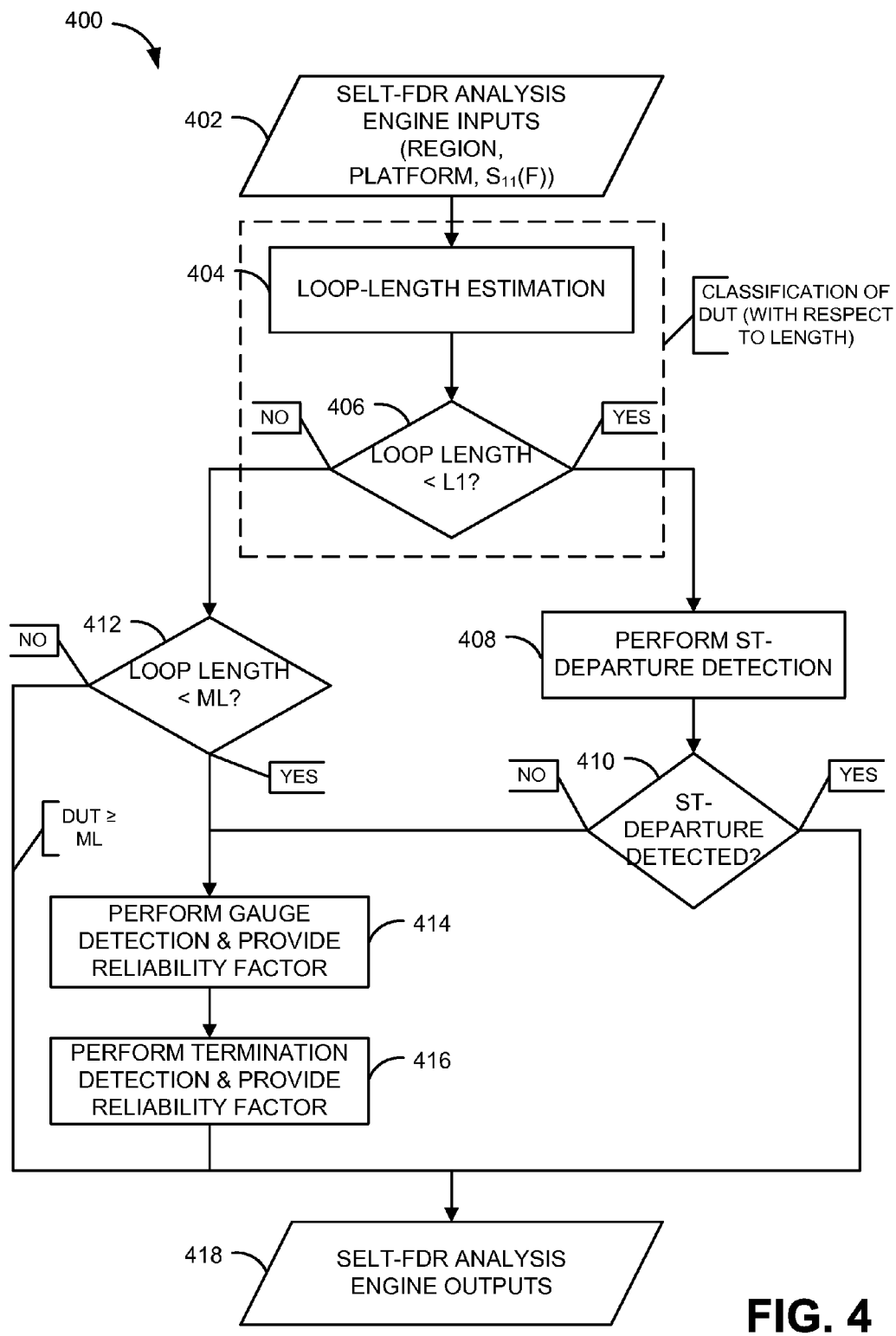
FIG. 4 is a top level flowchart for an embodiment of a process for performing FDR-SELT utilizing the components depicted in FIGS. 1, 2A-B.

FIG. 4 provides a top level flowchart for an embodiment of a process for performing un-calibrated FDR-SELT utilizing the components depicted in FIGS. 1, 2A-B. In particular, FIG. 4 is an embodiment of the overall analysis/processing performed using the un-calibrated echo response obtained for a particular loop. In accordance with exemplary embodiments, the steps discussed below may be performed by the FDR-SELT module 132 shown in FIG. 2A. Based on the un-calibrated echo response, such metrics as loop length, termination type, and loop gauge can be derived. The presence of any inconsistency in the raw echo signal leading to departure from straight-loop signal characteristics (e.g., inconsistencies owing to the presence of a bridge tap) can also be determined based on the echo response.

Step 402 begins by receiving the un-calibrated signal S11, platform, and region associated with the loop. In step 404, loop length estimation is performed. If the loop length is less than a threshold L1 (decision block 406), then a subsequent check is performed to determine whether the loop length is less than a second threshold ML, where ML is greater than or equal to L1, in decision block 412. As a non-limiting example, the value of L1 may be set to 9 kft (for North American loops). The threshold value L1 represents an intermediate loop length used to classify the DUT. In accordance with some embodiments, based on how the loop is classified, a particular method for estimating the loop length is performed. The threshold value L1 represents the maximum loop length at which the raw echo signal can be analyzed to determine whether the DUT is a straight loop (or is a departure from a straight loop). Step 404 and decision block 406 generally comprise the process of classifying the loop (or DUT) based on the loop length. It should be appreciated that the value of ML may extend up to 13.2 kft (~4 km). More details regarding determination of the loop classification type are provided below.

Referring back to decision block 412, if the loop length is greater than or equal to ML, then the steps involving loop gauge detection and loop termination detection are bypassed as attempts to determine these metrics may yield inaccurate results. If the loop length is less than threshold ML, then the loop gauge is detected and a corresponding reliability factor is derived (step 414). In step 416, the loop termination type and corresponding reliability factor is determined. This information, along with the loop length estimation, is then output in step 418. With reference back to decision block 406, if the loop length is less than threshold L1, then in step 408, a determination is made on whether the loop is a straight-loop (ST) departure, which may be due to, for example, the presence of a bridge tap, inappropriate joints in concatenated loops etc. If a straight-loop departure is detected, then the loop gauge and loop termination type are not determined. For some embodiments, a constant value such as "−1" may be output in step 418 to indicate that the steps for determining the loop gauge and loop termination type (i.e., steps 414, 416) were bypassed. If the loop is a straight loop, then steps 414 and 416 are performed.

Loop Length Estimation

In accordance with some embodiments, two methods may be used for estimating loop length. It should be noted that multiple methods are utilized in order to account for the significant amount of signal attenuation that occurs in loops greater than or equal to the threshold (L1). For such loop lengths, the characteristics typically relied upon to estimate loop length for shorter loops become imperceptible. Hence, due to the attenuation in the signal (S11), a second method is utilized to estimate the loop length of extended loops, as will be described in detail below. Referring back briefly to FIG. 4, in step 404, it should be noted that the loop length is estimated only up to a particular threshold (ML). Beyond this threshold, the loop length begins to exceed the measurement capabilities of the system. For loops determined to be too long, an indication is provided that a long loop exists.

Exemplary embodiments described herein are designed to cater to different CO designs (or platforms) and ports. Depending on the threshold detection outcome for a straight loop, the methodology can be classified into the following two categories or classifications: 1) length estimation for loops<threshold; and 2) length estimation for loops≧threshold (i.e., long reach loops). For purposes of nomenclature, the threshold will be referred to herein as "L1." For loop falling under the first classification (loops<L1), loop estimation is performed using a relative, rather than absolute, energy criterion in the form of the signal energy cumulative distribution function (CDF). The slope of the energy CDF over a specified range of bins is used to classify the loop under test with respect to the type of low-pass and high-pass filtering required.

The proper selection of filtering aids in accurate estimation of the average spacing between ripples inherent in the un-calibrated echo signal, S11. Either a low-pass filter or a succession of low-pass and/or high-pass filtering based on the slope of the energy CDF and/or an initial estimate of the loop length) may be applied to determine the periodicity of the ripples. Because the periodicity of ripples is preserved after calculating the derivative of the echo signal, the derivative may be utilized as a high-pass filter for the attenuated signal at longer loops. Any residual background noise is removed by performing signal averaging (i.e., low-pass filtering). The fact that the frequency of these ripples is directly proportional to the loop length allows the loop length to be estimated by determining the ripple-period of the filtered signal.

For loop length estimation of loops falling under the second classification discussed above (i.e., where the loop length≧L1), relevant information is extracted from the filtered echo response, with respect to the following: 1) the amplitude difference between the two envelopes (local maxima and minima); 2) the distribution of the local maxima; and 3) the distribution of the local minima of the filtered echo at specified tones or bins. The loop length is estimated by identifying the closest template in a look-up table where templates are specified at discrete length intervals, gauge and terminations based on a distance metric. In accordance with some embodiments, the Euclidean distance metric may be used. The final loop-length estimation is then based on the weighted average of the individual length estimates corresponding to the chosen templates pertaining to the three criteria stated above.

Figure 5A:
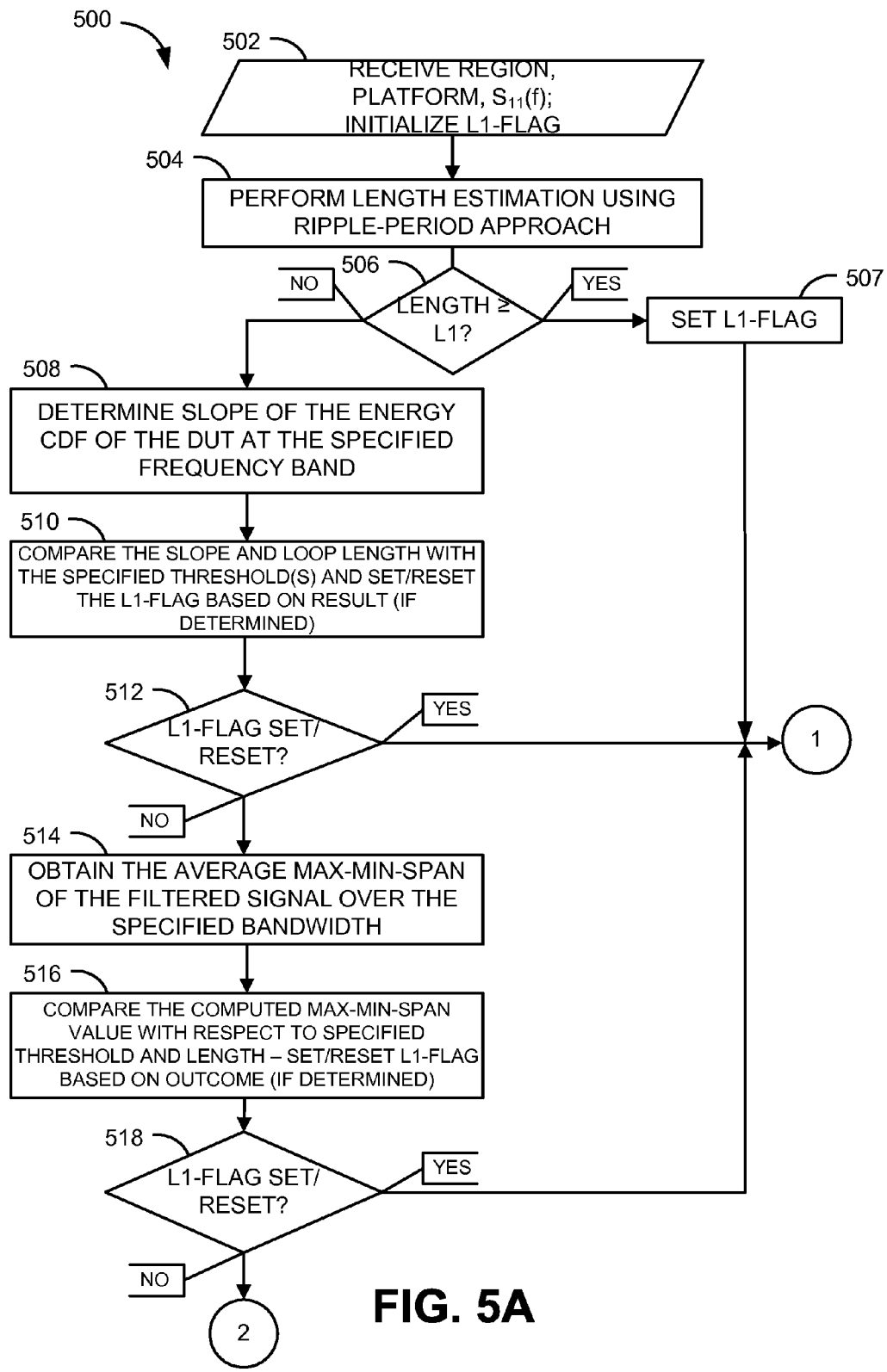
FIGS. 5A-B depict a flowchart for one embodiment of classifying a loop under test, as depicted in FIG. 4.
Figure 5B:
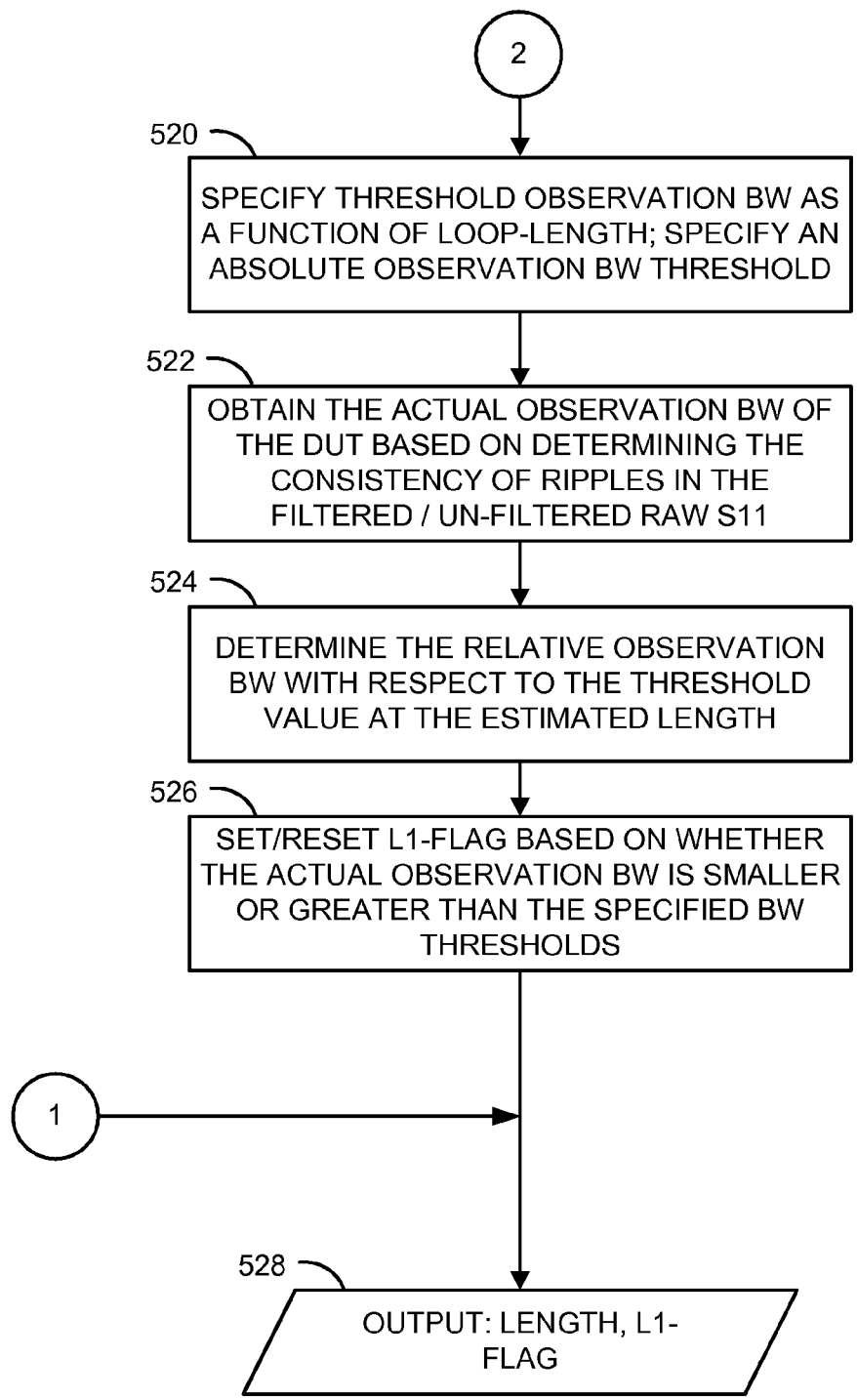

Reference is now made to FIGS. 5A-B, which is a flowchart for one embodiment for classifying a loop under test as depicted in FIG. 4. Block 502 begins by receiving S11, the platform type, and region associated with the loop (DUT). L1-Flag (defined below) is also initialized. In step 504, a preliminary loop length estimate is performed based on the ripple-period approach, which examines the frequency of ripples associated with an un-calibrated S11 signal. It should be emphasized that this, however, is only one of multiple factors used to characterize a given loop in order to accurately classify the loop. It should also be emphasized that in various steps discussed below, determination of a particular DUT classification may be triggered. Accordingly, subsequent steps in the process are bypassed.

With reference to decision block 506, if the loop length is greater than or equal to threshold L1, then the flag or indicator, denoted as L1-Flag in this disclosure, is set (step 507); otherwise, if the loop length is smaller than threshold L1, the slope of the energy cumulative distribution function (CDF) of the loop (DUT) is determined for a specified frequency band (step 508). This step is performed to help ensure that short loops are not incorrectly flagged as long loops. In step 510, the slope and the loop length are compared with specified thresholds based on the platform type specified in step 502, and, if the specified criterion is fulfilled, the L1-Flag is set or reset, based on this outcome. As a non-limiting example, the L1-Flag is set if the slope is smaller than the specified threshold for a specified range of loop length, thereby indicating that the loop is greater than L1. While L1-Flag is used to specify the classification of the DUT (less than or greater than and equal to L1), it should be emphasized that the classification can be specified in any number of ways.

In decision block 512, if the L1-Flag is not set or reset (i.e. L1-Flag equals the initialized value), than the average maxima-minima span of the ripples for the filtered signal is obtained over a specified bandwidth (step 514). This maxima-minima span is then compared to a threshold at the estimated loop length, based on the platform specified in step 502. As a non-limiting example, if the maxima-minima span is greater than the threshold, then the L1-Flag is reset in step 516, thereby indicating that the DUT is less than L1. In decision block 518, similar to step 512, if L1-Flag is not set or reset, then in step 520 a threshold observation bandwidth is specified as a function of loop length. An absolute observation bandwidth threshold is also specified. The actual (relevant) observation bandwidth of the DUT is obtained based on the consistency of ripples in the filtered/unfiltered raw echo signal S11(step 522). The "relevant" observation bandwidth is defined as the band across which the local maxima and minima in the filtered S11 signal occur consistently.

In step 524, the relative observation bandwidth, which is the actual observation bandwidth with respect to the threshold value at the estimated loop length obtained from step 504, is determined. In step 526, the actual observation bandwidth undergoes one or more comparisons with the specified observation bandwidth threshold values. As a non-limiting example, the L1-Flag is set if the actual observation bandwidth is less than the specified absolute bandwidth threshold value. The L1-Flag is determined eventually based on multiple criteria which are carried out conditionally and sequentially in a pre-defined order to help ensure accuracy in DUT classification. Accordingly, the L1-Flag along with the estimated loop length are output in step 528.

Figure 6:
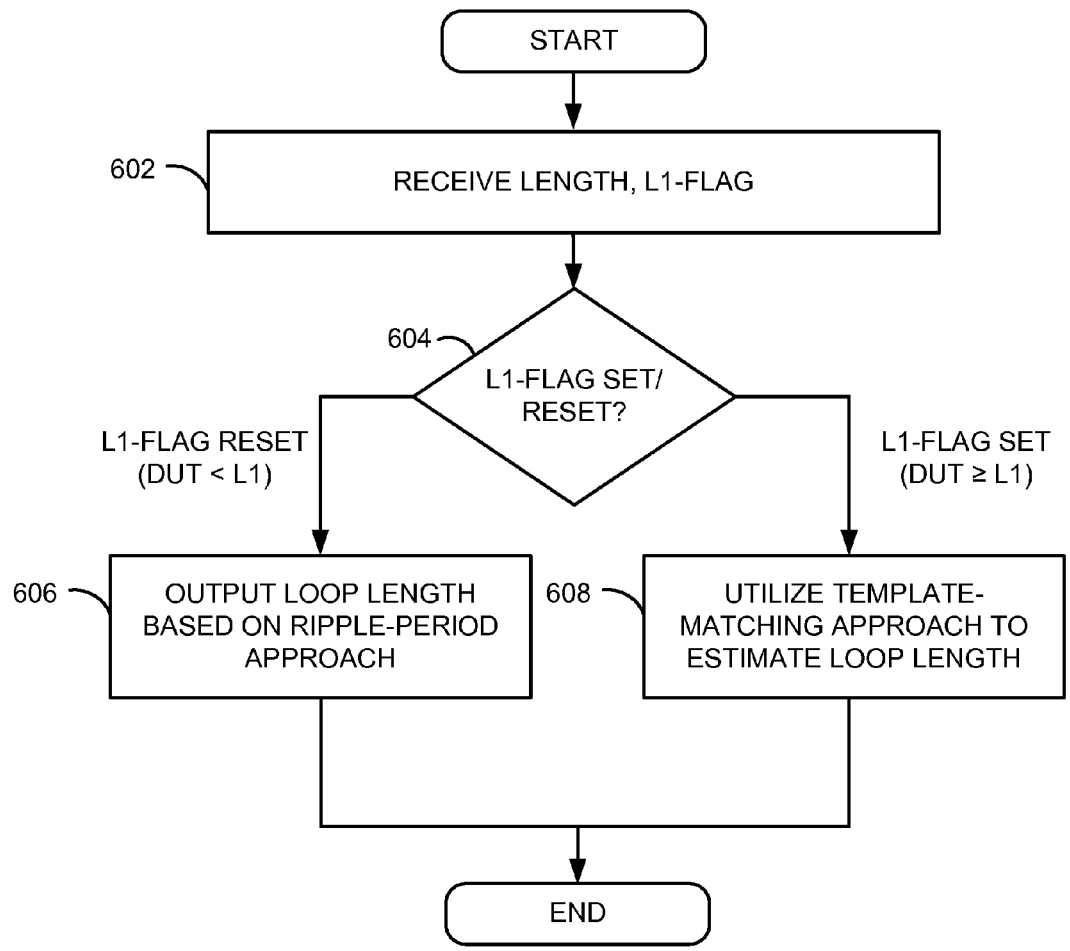
FIG. 6 is a flowchart for an embodiment for estimating the loop length, as depicted in FIG. 4 and as described in relation to FIGS. 5A-B.

Reference is now made to FIG. 6, which is a flowchart for an embodiment for estimating the loop length, as depicted in FIG. 4 and as described in relation to FIGS. 5A-B. Beginning in step 602, the loop classification (specified using L1-Flag) derived in FIGS. 5A-B along with the loop length estimate, based on the ripple-period approach, are received and depending on the classification (i.e., loop<L1 or loop≧L1), the loop length is estimated using a particular method (decision block 604). In particular, if the loop is less than the threshold (where L1-Flag is not set), then the loop length estimate obtained using the ripple-period approach in FIG. 5 is output (step 606). If the loop is greater than or equal to the threshold (L1), then a template-matching approach is used to estimate the loop length (block 608). It should be emphasized, however, that while different methods for loop length estimation are utilized, the ripple-period approach may be utilized across the entire range (i.e., up to a loop length equal to ML). Moreover, the template-based matching approach described herein may also be utilized across the entire range. In preferred embodiments, however, a combination of the ripple-period approach and the template-based matching approach is utilized as this typically provides the most efficient use of platform resources pertaining to, for example, storage, processing, and system bandwidth.

Various embodiments for estimating the loop length based on the ripple-period approach are now described. The basis for utilizing ripple characteristics of the un-calibrated S11 parameter to calculate a loop length is first discussed. By analyzing the one-port scattering parameter (S11) of the loop under test as a function of frequency, certain behavior may be monitored which is dependent on the loop length. In particular, the period of ripples observed in the amplitude of the S11 signal depends largely on the loop length and is generally independent of the particular loop gauge or termination type. As a result, the period of the ripples can be utilized to estimate the loop length.

Figure 7A:
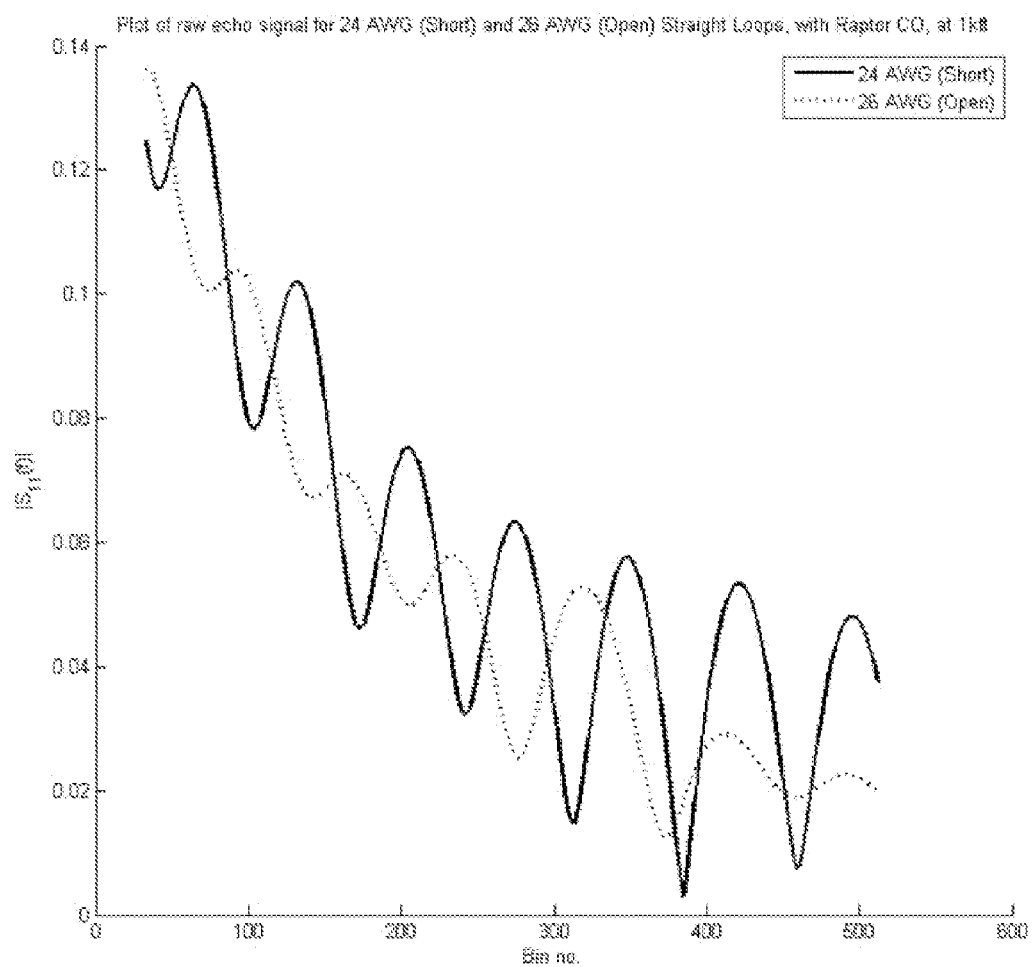
FIGS. 7A-B depict various plots of the S11 signal as a function of frequency.
Figure 7B:
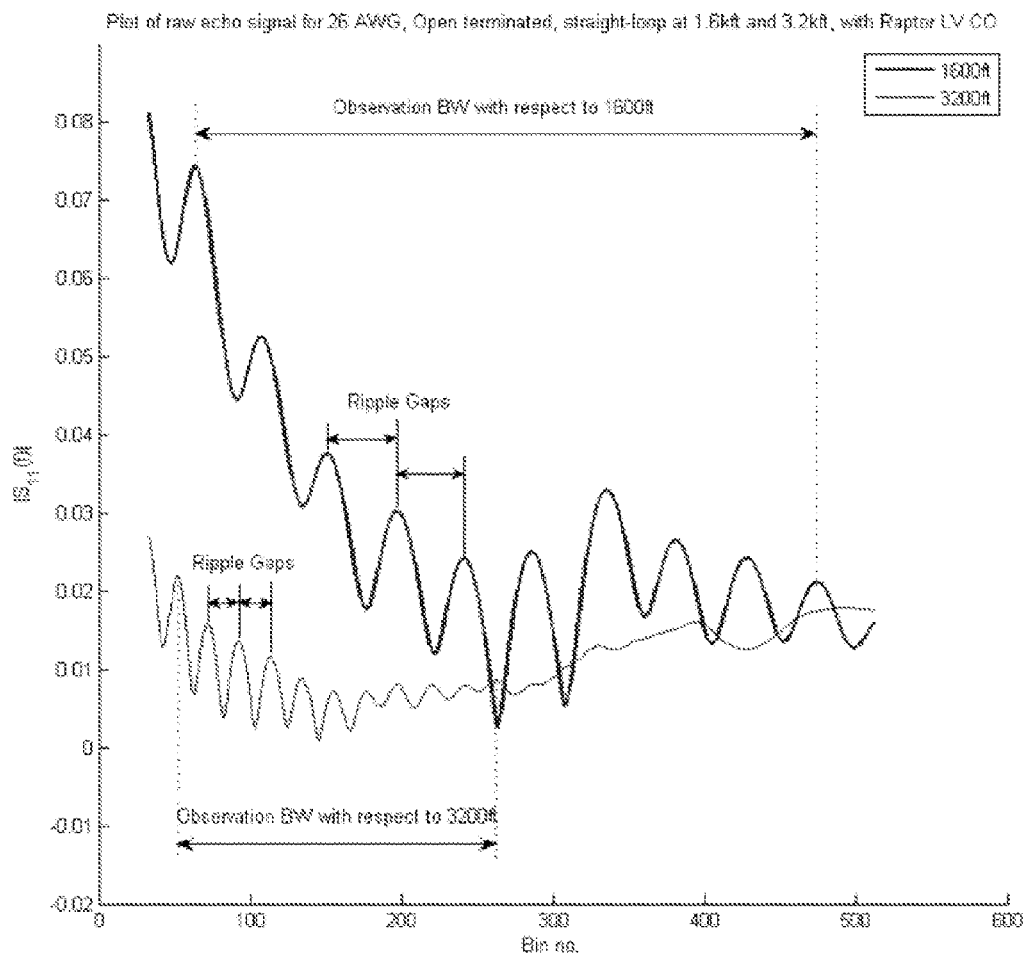

Reference is made to FIGS. 7A and 7B, which depict various plots of the S11 signal as a function of frequency. As depicted in FIG. 7A, the period of the ripples (observed in the amplitude of the S11 signal) depends on the loop length and is largely independent of the loop gauge and loop termination. Further, as depicted in FIG. 7B, a greater level of attenuation in the S11 signal is observed at higher frequencies for longer loops. As a result, the S11 signal experiences ripples with consistent ripple-spacing at lower frequencies for a relatively small bandwidth. Thus, for exemplary embodiments, the observed bandwidth of the input signal is identified and restricted in order to observe a consistent distribution of ripples. Generally, the process for estimating loop length involves a training phase, which is performed in order to obtain region-specific coefficients. This information is later used when the loop under test is being analyzed. It should be emphasized that the relative energy criterion is used to determine the type of filtering applied to the DUT in order to accurately determine the average spacing between the ripples.

Figure 8A:
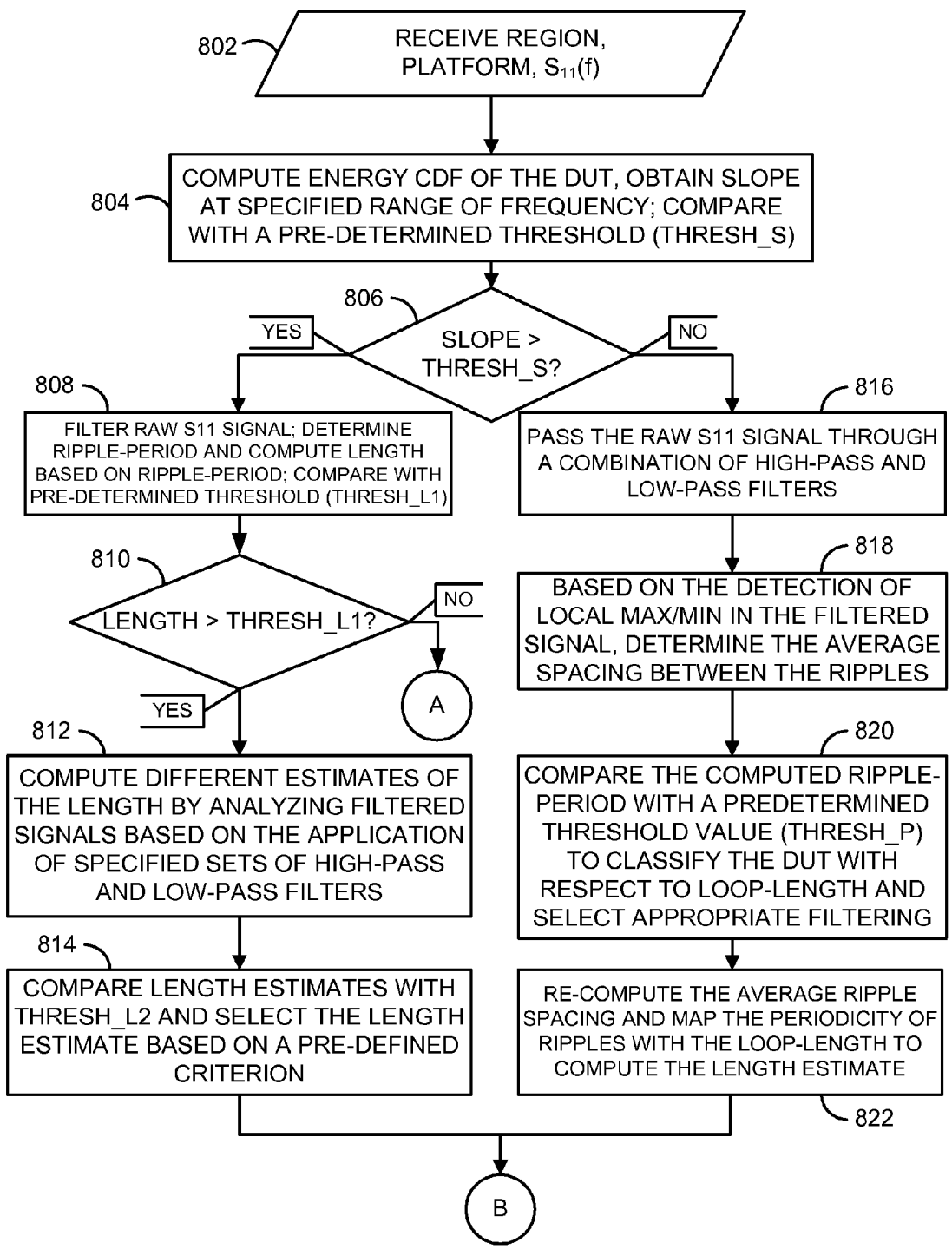
FIGS. 8A-B depict a flowchart for an embodiment for estimating the loop length using the ripple-period approach, as depicted in FIG. 6.
Figure 8B:
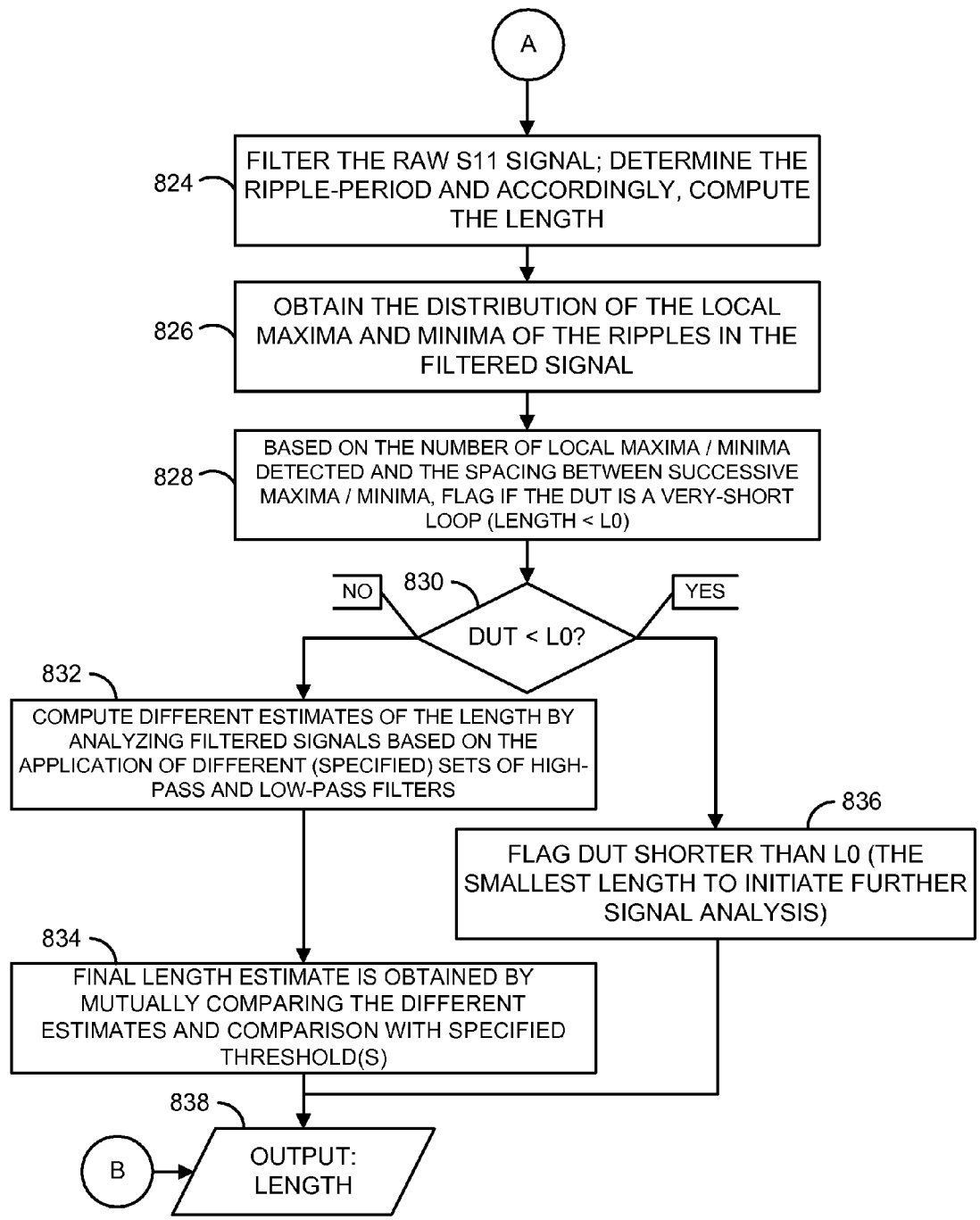

FIGS. 8A-B depict a flowchart for an embodiment for estimating the loop length based on a ripple-period approach, as depicted in FIG. 6. Generally, the un-calibrated S11 parameter obtained through SELT-FDR is received, and the relevant region or country associated with the loop environment is specified. The platform type associated with the DUT is also received. In the context of the embodiments described herein, the region will generally be specified as "North America." It should be emphasized, however, that the regions are not limited to this region and that the concepts described herein can be applied to other regions as well.

With reference now to FIGS. 8A-B, in step 802, the region (e.g., North America), platform, and the un-calibrated $S_{11}(f)$ parameter are received. In step 804, the energy cumulative distribution function (CDF) of the S11 signal is calculated, and the slope for a specified range of frequencies is compared with a predetermined threshold (denoted herein as Thresh_S). In accordance with some embodiments, the value Thresh_S may be predetermined. Based on the platform specified in step 802, a corresponding value for Thresh_S may be retrieved.

If the slope is greater than Thresh_S, the raw S11 signal is filtered using a pre-defined set of filters, which is usually a combination of low-pass and high-pass filters. The ripple-period of the filtered signal is then computed, and a loop length estimate is derived based on the ripple-period (step 808). A check is made in decision block 810 on whether the estimated loop length is greater than a second threshold, Thresh_L1. In accordance with some embodiments, the value of Thresh_L1 may be set to 900 ft (for North American loops). If the loop length is greater than Thresh_L1, then in step 812, different loop length estimates are computed based on the application of specified sets of high-pass and low-pass filters. In step 814, these loop lengths are compared with a third threshold, Thresh_L2, and a loop length estimate is selected based on pre-defined criterion. In accordance with some embodiments, Thresh_L2 may be set to a value of 2.5 kft. The selected loop length estimate is then output (step 838).

If the loop length is less than Thresh_L1, then the raw S11 signal is filtered, using a pre-defined set of filters which is usually a combination of low-pass and high-pass filters, and the ripple-period is then determined. Based on the ripple-period, the loop length is estimated (step 824). In step 826, the distribution of local maxima and minima of the ripples in the filtered S11 signal is obtained. Based on the number of local maxima/minima detected and based on the spacing between successive maxima/minima, the DUT may be flagged as being a very short loop, i.e. smaller than the threshold L0. As a non-limiting example, if the spacing between successive maxima/minima exceeds a predetermined value, which is obtained as a fraction of the average maxima/minima-spacing, a determination is made that the DUT is a very short loop. A determination is made on whether the DUT is a very short loop based on the fact that for increasingly shorter loop lengths, the ripple-period increases. Below a certain minimum loop length, the bandwidth required to determine the ripple-period may exceed the measuring capabilities of the platform, and the ripple-period cannot be determined. This minimum loop length is denoted herein as L0 and may be platform-specific.

In decision block 830, if the DUT is less than L0 (i.e., the DUT is a very short loop), an indication is given that the loop is a very short loop (step 836). For some embodiments, the loop length estimate may be set to a constant value to indicate that a loop length estimate could not be obtained. As a non-limiting example, the loop length estimate may be assigned a constant value of "−1" for very short loops. Referring back to decision block 830, if the DUT is not a very short loop, then in step 832, different loop length estimates are computed by analyzing filtered signals based on the application of different sets of high-pass and low-pass filters. In step 834, a final loop length estimate is obtained by comparing the different loop length estimates with predetermined thresholds. For preferred embodiments, the predetermined thresholds are retrieved based on the platform specified in step 802.

With reference back to decision block 806, if the slope is less than or equal to Thresh_S, then in step 816, the raw S11 signal is passed through a combination of high-pass and low-pass filters. Based on the detection of local maxima/minima, the average spacing or gap between ripples in the filtered S11 signal is computed in step 818. In step 820, this computed ripple-period, or average spacing between ripples, is compared against a predetermined threshold value (denoted herein as Thresh_P) to broadly classify the DUT with respect to loop length. Based on the classification, appropriate filtering is employed by selecting from a range of combination of high-pass and low-pass filters. In some embodiments, data relating to ripple-period as a function of loop-length is retrieved based on the platform specified in step 802. In step 822, the average ripple-period is recomputed and mapped with loop-length to derive a loop length estimate. The estimated loop length is then output in step 838.

Figure 9:
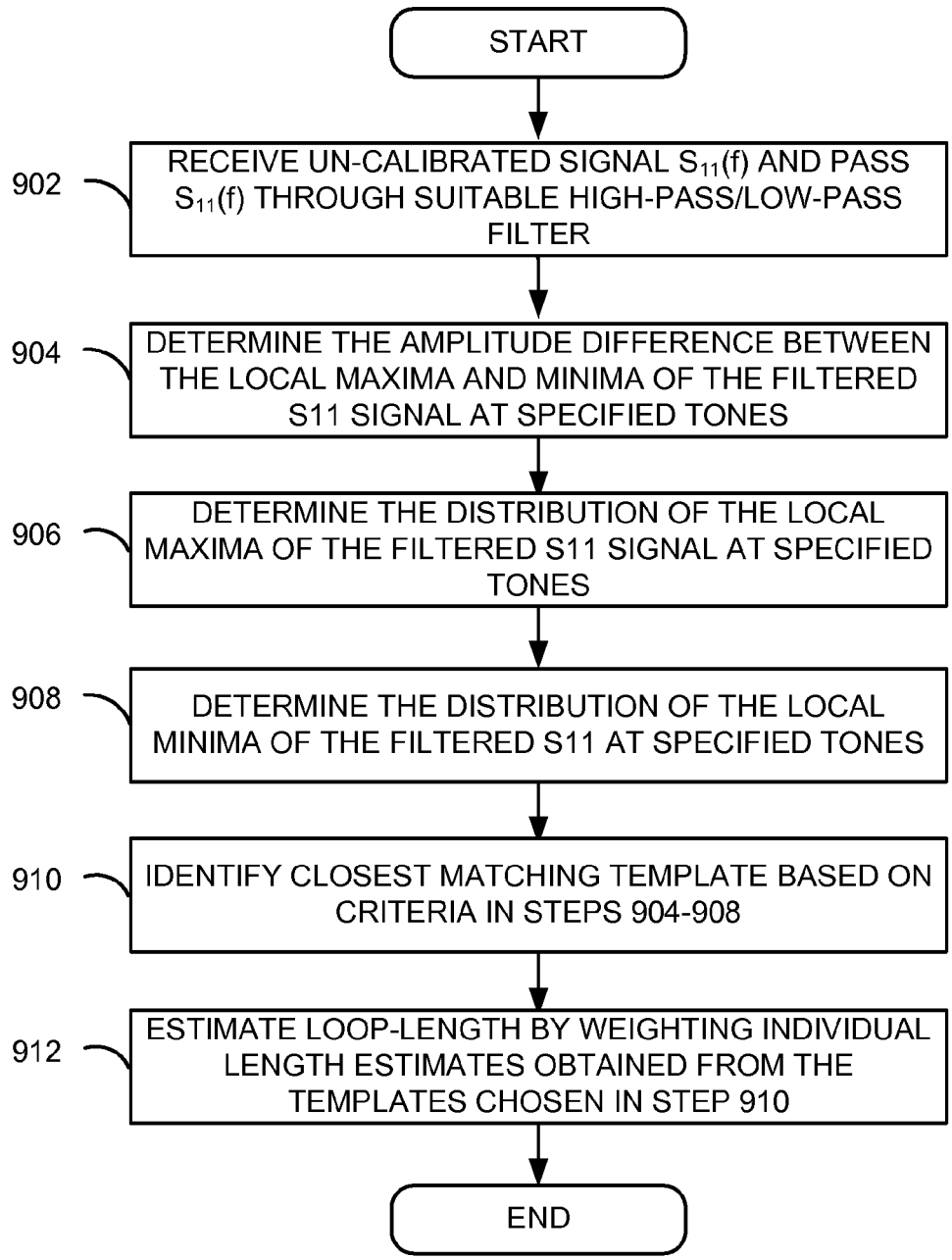
FIG. 9 depicts a flowchart for an embodiment for estimating the loop length using a template-matching approach, as depicted in FIG. 6.

FIG. 9 depicts a flowchart for an embodiment for estimating the loop length using a template-matching approach, as depicted in FIG. 6. For loop length estimation of loops falling under the second classification discussed above (loops≧L1), the un-calibrated signal is received and passed through a suitable combination of high-pass and low-pass filters (step 902). The following steps are then performed: 1) determine the amplitude difference between the two envelopes (local maxima and minima) of the filtered S11 signal at specified tones (step 904), 2) determine the distribution (e.g., position, amplitude, slope) of the local maxima of the filtered S11 signal at specified tones (step 906), and 3) determine the distribution of the local minima of the filtered S11 at specified tones (step 908). Based on the above stated three criteria, the closest matching template is identified (step 910) from a look-up table, where the templates are specified at discrete length intervals, gauge and terminations. In accordance with some embodiments, a closest matching template may be identified based on the Euclidean distance metric. It should be emphasized, however, that for other embodiments, different criteria of the local maxima-minima and metrics (e.g., Manhattan distance metric) may be utilized to determine the closest matching template. The final estimate of the loop length is obtained in step 912 by weighting the individual length estimates, corresponding to the chosen templates in step 910. One of ordinary skill in the art will appreciate how the weighting function is performed. As discussed earlier, it should be emphasized that the embodiments described above should not be limited to the particular sequence of steps described. As one of ordinary skill in the art will appreciate, other sequences of steps may be possible, and the particular order of steps set forth herein should not be construed as limitations on the claims.

It should be noted that the invention is not limited to the embodiments described above. Further, it should be noted that while the processes herein are described for the North American region, many variations and modifications may be made to the above-described embodiments without departing from the principles of the present disclosure such that other regions can be supported. Accordingly, it should be emphasized that the above-described embodiments are merely examples of possible implementations. All such modifications and variations are intended to be included herein within the scope of this disclosure and protected by the following claims.

At least the following is claimed:

1. A method comprising:
receiving an un-calibrated echo signal for a loop under test using frequency domain reflectometry single-ended line testing (FDR-SELT), a region associated with the loop under test, and a platform type;
classifying the loop under test; and
outputting a loop length estimate based on the classification of the loop under test and based on one of a ripple-period approach and a template-matching approach.

2. The method of claim 1, wherein classifying the loop under test comprises:
performing a preliminary loop length estimate using the ripple-period approach; and
determining whether the loop length estimate is less than a first threshold or whether the loop length is greater than or equal to the first threshold.

3. The method of claim 2, wherein determining whether the loop length estimate is less than the first threshold or whether the loop is greater than or equal to the first threshold comprises:
in response to failing to classify the loop under test based on a first criterion, classifying the loop under test based on a second criterion by determining a slope of an energy cumulative distribution function (CDF) of the un-calibrated echo signal and comparing the slope with predetermined slope thresholds,
wherein the predetermined slope thresholds are predetermined based on the platform type and the preliminary loop length estimate, and
wherein the first criterion comprises determining whether the preliminary loop length estimate is greater than or equal to the first threshold.

4. The method of claim 3, further comprising:
classifying the loop under test based on the comparison of the slope;
in response to failing to classify the loop under test based on the second criterion, classifying the loop under test based on a third criterion comprising:
filtering the un-calibrated echo signal using a combination of high-pass and low-pass filters;
obtaining an average maxima-minima span of the filtered un-calibrated echo signal by comparing the average maxima-minima span to a predetermined threshold based on the preliminary loop length estimate; and classifying the loop based on the comparison of the average maxima-minima span.

5. The method of claim 4, further comprising:

in response to failing to classify the loop under test based on the third criterion, classifying the loop under test based on a fourth criterion comprising:

specifying a set of observation bandwidth thresholds;

determining an observation bandwidth of the loop under test based on consistency of ripple-spacing in the filtered un-calibrated echo signal; and classifying the loop under test based on one or more comparisons of the observation bandwidth with the specified observation bandwidth thresholds.

6. The method of claim 2, wherein estimating the loop length based on the ripple-period approach comprises:

determining an energy cumulative distribution function (CDF) associated with the un-calibrated echo signal and obtaining a slope of the CDF;

comparing the slope with a predetermined CDF slope threshold;

in response to determining that the slope is greater than the predetermined CDF slope threshold, filtering the un-calibrated echo signal using a combination of high-pass and low-pass filters and determining a ripple-period of the filtered un-calibrated echo signal;

computing a length based on the ripple-period of the filtered un-calibrated echo signal; comparing the length with a first predetermined length threshold;

in response to determining that the length is greater than the first predetermined length threshold, computing different loop length estimates based on an application of predetermined sets of filters to the un-calibrated echo signal; and comparing the loop length estimates with a second predetermined length threshold and selecting a final loop length based on a matching criterion, wherein the CDF slope threshold, the first predetermined length threshold, and second predetermined length threshold are determined based on the platform type.

7. The method of claim 6, further comprising:

in response to determining that the slope is less than or equal to the CDF slope threshold, filtering the un-calibrated echo signal using a combination of high-pass and low-pass filters and determining a ripple-period of the filtered un-calibrated echo signal; and determining a loop length estimate based on the ripple-period.

8. The method of claim 7, wherein in response to determining that the length is less than or equal to the first predetermined length threshold, filtering the un-calibrated echo signal and determining a ripple-period of the filtered un-calibrated echo signal;

determining a distribution of local maxima and minima of ripples on the filtered un-calibrated echo signal;

based on the distribution of the local maxima and minima, determining whether the loop under test is a short loop based on a second threshold;

in response to determining that the loop under test is a short loop, indicating that the loop is a short loop.

9. The method of claim 8, further comprising:

in response to determining that the loop under test is not a short loop, computing a plurality of loop length estimates based on an application of a predetermined sets of filters based on the platform type; and selecting a final loop length estimate from the plurality of loop length estimates based on comparison with predetermined length thresholds;

outputting the final loop length estimate.

10. The method of claim 2, wherein in response to determining that the loop length of the loop under test is less than the first threshold, classifying the loop as being less than the threshold; and in response to classifying the loop as being less than the threshold, outputting the loop length using the ripple-period approach.

11. The method of claim 2, wherein in response to determining that the loop length of the loop under test is greater than or equal to the first threshold, classifying the loop as being greater than or equal to the threshold; and in response to classifying the loop as being greater than or equal to the threshold, estimating the loop length using the template-matching approach.

12. The method of claim 11, wherein the template-matching approach comprises:

filtering the un-calibrated signal using a combination of high-pass and low-pass filters;

determining an amplitude difference between local maxima and minima of the filtered un-calibrated signal at predetermined frequencies;

determining a distribution of local maxima of the filtered un-calibrated signal at predetermined frequencies;

determining distribution of local minima of the filtered un-calibrated signal at predetermined frequencies;

identifying a set of closest matching templates to derive a set of individual loop length estimates based on at least the following:

the amplitude difference, the distribution of local maxima, and the distribution of local minima, wherein the templates are defined at discrete length intervals, gauge, and terminations;

weighting the set of individual loop length estimates to obtain a final loop length estimate; and outputting the final loop length estimate.

13. The method of claim 12, wherein the distribution of local maxima and local minima comprises:

locations of maxima and minima of the filtered un-calibrated echo signal;

amplitudes of maxima and minima; and slopes of envelope of maxima and minima.

14. The method of claim 12, wherein identifying a closest matching template comprises identifying a lowest distance metric for each of the amplitude difference, the distribution of local maxima, and the distribution of local minima.

15. A method comprising:

receiving a region, a platform type, and an un-calibrated echo signal of a loop under test;

determining a preliminary loop length estimate based on one of a ripple-period approach and a template-matching approach;

determining whether the preliminary loop length estimate is greater than or equal to a first threshold; and in response to determining that the preliminary loop length estimate is greater than or equal to the first threshold, determining whether the preliminary loop length estimate is less than a second threshold;

in response to determining that the preliminary loop length estimate is less than the second threshold, performing a classification of the loop by performing one or more of the following:
　performing loop gauge detection; and
　performing loop termination detection.

16. The method of claim 15, further comprising:
in response to determining that the preliminary loop length estimate is greater than or equal to the second threshold, indicating that the preliminary loop length estimate is greater than or equal to the second threshold.

17. The method of claim 16, further comprising:
in response to determining that the preliminary loop length estimate is less than the first threshold, performing straight-loop departure detection on the loop under test and indicating the presence of a straight-loop departure;
in response to determining that the loop under test is not a straight-loop departure,
　performing loop gauge detection; and
　performing loop termination detection.

18. The method of claim 15, wherein the ripple-period approach comprises:
　analyzing an energy cumulative distribution function (CDF) of the un-calibrated echo signal;
　filtering the un-calibrated echo signal using a combination of high-pass and low-pass filters;
　determining a ripple-period of the filtered, un-calibrated echo signal; and
　estimating the loop length based on mapping the ripple-period with a loop length.

19. The method of claim 15, wherein the template-matching approach comprises:
　receiving the un-calibrated signal and filtering the un-calibrated signal using a combination of high-pass and low-pass filters;
　determining an amplitude difference between local maxima and minima of the filtered un-calibrated signal at predetermined frequencies;
　determining a distribution of local maxima of the filtered un-calibrated signal at predetermined frequencies;
　determining distribution of local minima of the filtered un-calibrated signal at predetermined frequencies;
　identifying a set of closest matching templates to derive a set of individual loop length estimates based on at least the amplitude difference, the distribution of local maxima, and the distribution of local minima; and
　weighting individual loop length estimates to calculate a value to be used as the preliminary loop length estimate.

20. A system comprising:
a first module coupled to a loop under test, the first module configured to generate a test signal and receive an un-calibrated echo response of the loop under test; and
a second module configured to receive the un-calibrated echo response measurement from the first module, classify the loop under test, determine a length estimate of the loop under test based on the classification of the loop under test and the un-calibrated echo response, and output the loop length estimate.

21. The system of claim 20, wherein the first module comprises:
　a signal generator to send a test signal onto the loop;
　an analyzer configured to measure scattering parameters (s-parameters) based on the reflected signal and determine the echo response of the loop.

22. The system of claim 20, wherein the second module is configured to classify the loop under test with respect to loop length based on a first threshold associated with a preliminary loop length estimate, and performing a final estimate of the loop length using one of:
　a ripple-period analysis component; and
　a template-matching component, wherein the component utilized is based on how the loop under test is classified.

23. The system of claim 22, wherein the template-matching component comprises:
　logic for receiving the un-calibrated signal and filtering the un-calibrated signal using a combination of high-pass and low-pass filters;
　logic for determining an amplitude difference between local maxima and minima of the filtered un-calibrated signal at predetermined frequencies;
　logic for determining a distribution of local maxima of the filtered un-calibrated signal at predetermined frequencies;
　logic for determining distribution of local minima of the filtered un-calibrated signal at predetermined frequencies;
　logic for identifying a set of closest matching templates to derive a set of individual loop length estimates based on at least the amplitude difference, the distribution of local maxima, and the distribution of local minima; and
　logic for weighting the set of individual loop length estimates to obtain a final loop length estimate.

24. The system of claim 22, wherein the ripple-period analysis component comprises:
　logic for analyzing an energy cumulative distribution function (CDF) of the un-calibrated echo signal;
　a module configured to filter the un-calibrated echo signal using a combination of high-pass and low-pass filters;
　logic for determining a ripple-period of the filtered un-calibrated echo signal; and
　logic for estimating the loop length by mapping the ripple-period with a loop length.

* * * * *

UNITED STATES PATENT AND TRADEMARK OFFICE
CERTIFICATE OF CORRECTION

PATENT NO. : 8,295,444 B2  
APPLICATION NO. : 12/138692  
DATED : October 23, 2012  
INVENTOR(S) : Dinesh et al.

Page 1 of 1

It is certified that error appears in the above-identified patent and that said Letters Patent is hereby corrected as shown below:

Title Page Item (75), under "Inventors", in Column 1, Line 1, delete "Dehli" and insert -- Delhi --, therefor.

In the Claims:

In Column 16, Line 16, in Claim 22, delete "performing" and insert -- perform --, therefor.

Signed and Sealed this
Third Day of September, 2013

Teresa Stanek Rea
*Acting Director of the United States Patent and Trademark Office*